United States Patent [19]

Koo

[11] 4,079,462

[45] Mar. 14, 1978

[54] REFRESHING APPARATUS FOR MOS DYNAMIC RAMS

[75] Inventor: James T. Koo, Sunnyvale, Calif.

[73] Assignee: Intel Corporation, Santa Clara, Calif.

[21] Appl. No.: 684,398

[22] Filed: May 7, 1976

[51] Int. Cl.² .............................................. G11C 11/40
[52] U.S. Cl. .................................... 365/222; 307/238; 365/189
[58] Field of Search .................... 340/173 R, 173 DR; 307/238, 279

[56] References Cited

U.S. PATENT DOCUMENTS 3,737,879  6/1973  Greene et al. ................ 340/173 DR
3,760,379  9/1973  Nibby et al. .................. 340/173 DR Primary Examiner—Terrell W. Fears
Attorney, Agent, or Firm—Blakely, Sokoloff, Taylor & Zafman

[57] ABSTRACT

A refreshing apparatus for an MOS dynamic RAM which permits a 128 line × 128 line memory to be refreshed in 64 cycles. The row decoders operate with one less address bit during the refreshing cycle, thereby permitting the simultaneous selection of two row lines. The memory includes two rows of column amplifiers to facilitate the refreshing of cells coupled to two selected row lines.

9 Claims, 3 Drawing Figures

REFRESHING APPARATUS FOR MOS DYNAMIC RAMS

BACKGROUND OF THE INVENTION

1. Field of the Invention

The invention relates to the field of dynamic MOS RAMS and in particular to refreshing or regeneration means for such memories.

2. Prior Art

In metal-oxide-semiconductors (MOS) integrated circuit random-access memories (RAM) capacitive storage memory cells are frequently employed. In these dynamic memory cells information is stored in the form of an electrical charge on a capacitance means. These memory cells provide lower power storage and are suitable for higher density fabrication than static memory cells.

Since capacitance storage is dynamic, that is, the charge representing a binary state quickly disipates, periodic refreshing or regeneration is required. This refreshing is accomplished (in other than the planar refreshable memories) by refreshing the memory cells located along a single column line or row line in the memory. For a general discussion of this technique see U.S. Pat. No. 3,599,180. In recent years, the storage capacity and particularly the storage density of dynamic RAMS has been on a continuing increase. This increase has required longer refresh cycles.

Some dynamic RAMS known in the art are capable of "planar refreshing," that is, the entire memory array is simultaneously refreshed. However, the memory cells employed in such memories are substantially larger than the memory cells employed in other dynamic RAMS. For an example of a planar refreshable memory which does not require synchronization of the refreshing signal and memory access signal, see U.S. Pat. No. 3,858,185.

Other problems associated with the refreshing of dynamic RAMS are discussed in U.S. Pat. No. 3,806,898 and U.S. Pat. No. 3,760,379.

As will be seen the invented apparatus permits simultaneous refreshing of cells located along two lines of the memory, thereby reducing the refreshing time required by prior art dynamic MOS RAMS.

SUMMARY OF THE INVENTION

A dynamic MOS RAM is disclosed which includes a plurality of lines each of which is coupled to at least one dynamic memory cell. Decoding means which are coupled to these lines, receive address signals for the purpose of selecting one of the lines such that data may be read into, or from, memory cells coupled to the selected line. The memory includes refreshing means for refreshing the data stored in the dynamic memory cells. The refreshing means is coupled to the decoding means such that during refreshing at least two lines in the array are selected by the decoding means for each address signal received by the memory. In this manner the cells in the memory may be more quickly refreshed.

DETAILED DESCRIPTION OF THE INVENTION

A dynamic MOS RAM including refreshing means is described. In the presently preferred embodiment the memory comprises a 16K RAM arranged, as will be described, in two 128 × 64 line arrays. The entire memory for the described embodiment, including the memory cells, decoders, and refreshing means of the present invention, are fabricated on a single silicon substrate with known MOS technology. In the presently preferred embodiment, all the active MOS devices comprise enhancement mode, n-channel, field-effect transistors which employ polycrystalline silicon gates. Other circuitry employed in this described embodiment of the random-access memory is disclosed in copending application Ser. No. 569,927 filed on Apr. 21, 1975 now U.S. Pat. No. 3,978,459, and assigned to the assignee of this application.

Figure 1:
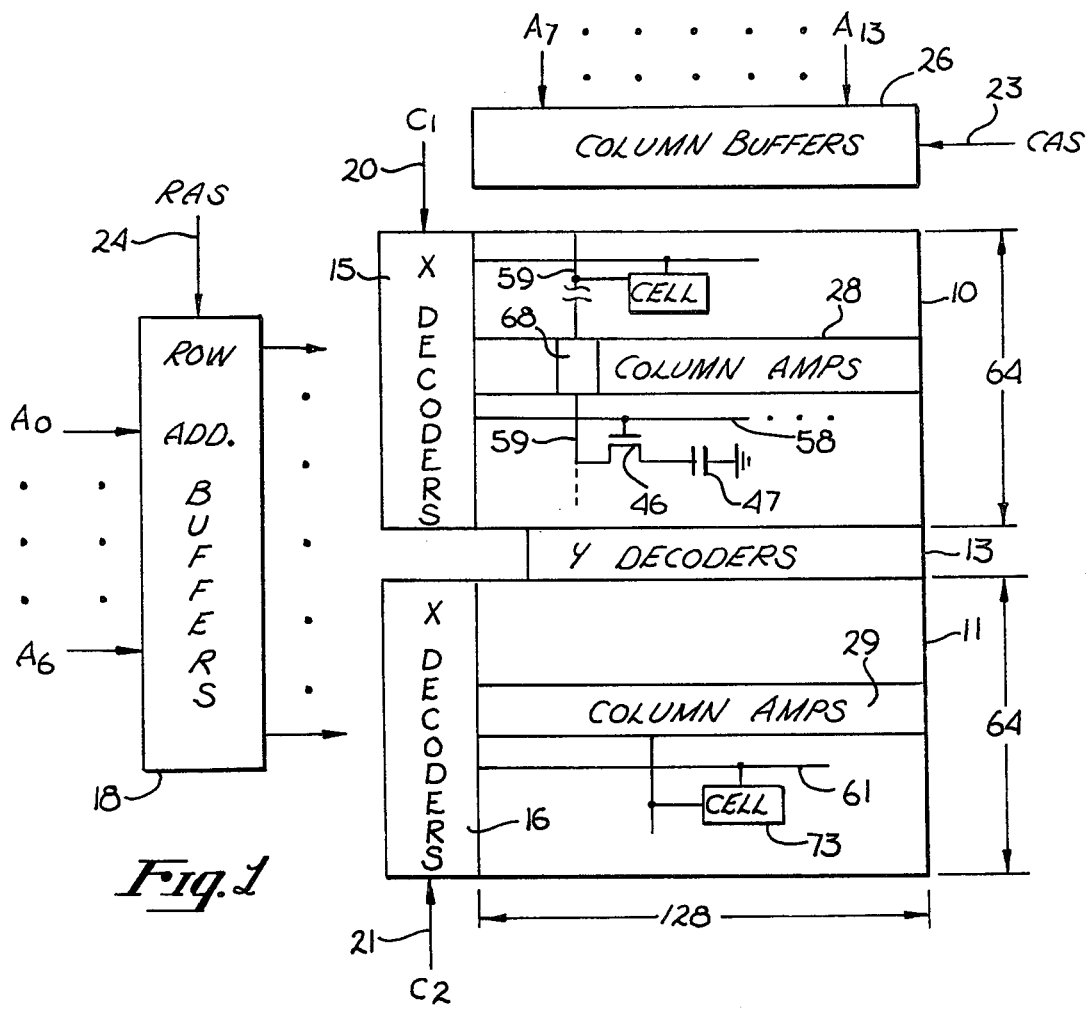
FIG. 1 is an overall block diagram of the memory employing the invented refreshing apparatus.

Referring to FIG. 1, in the presently preferred embodiment, the RAM is divided into two arrays, array 10 and array 11. Each array includes 128 column lines and 64 transversely disposed row lines. A single set of column decoders or Y-decoders 13 is disposed between arrays 10 and 11. The decoders 13 communicate with the column buffers 26, which buffers receive the column address signals $A_7$ through $A_{13}$. These address signals are decoded by the decoders 13 such that a column line in either array 10 or 11 is selected for each column address. (One column line 59 is shown in array 10). In the presently preferred embodiment the Y-decoder outputs are ANDed with either $A_6$ of $\overline{A_6}$, except during refresh. Ordinary buffer means and decoding means may be employed for the buffers 26 and decoders 13.

In both arrays 10 and 11 each of the column lines is bisected by a column amplifier. For example, amplifier 68 bisects column line 59 in array 10. The column amplifiers each form a row of amplifiers shown as column amplifiers 28 for array 10 and column amplifiers 29 for array 11. Each column amplifier comprises a bistable, or flip-flop like circuit, used both for sensing the binary state of memory cells and for refreshing memory cells. A detailed description of these sense amplifiers and the method by which they are activated is described in copending application Ser. No. 569,927 filed Apr. 21, 1975, now U.S. Pat. No. 3,978,459 and assigned to the assignee of this application.

Each of the plurality of column lines, such as line 59, communicates with input/output circuitry, not illustrated, in order that information may be read into, and from, the arrays 10 and 11. In the presently preferred embodiment a single input/output line or bus is employed, thus for access purposes, the described RAM is 1 × 16,384.

Array 10 includes 64 row lines such as row lines 58. Each row line is coupled to an X or row decoder within decoders 15. Similarly, array 11 includes 64 row lines such as row line 61, each of which is coupled to an X or row decoder within decoders 16. Decoders 15 and 16 may be similar to ordinary decoding means, however modified, as will be described in conjunction with FIG. 3, to enable simultaneous refreshing of cells in both arrays 10 and 11. Decoders 15 and 16 are coupled to the row address buffers 18 which buffers receive the row address signals $A_0$ through $A_6$. The X decoders 15 and the X decoders 16 employ the signals $A_0$ through $A_5$ (and their complements) in an ordinary manner to decode these signals. The address signal $A_6$, however, is used to generate the signals $C_1$ and $C_2$ applied to lines 20 and 21, respectively, as will be explained in conjunction with FIG. 3. These signals permit the selection of a single row line in arrays 10 and 11 when the memory is accessed, and also permit the selection of two row lines, one in each of the arrays, during the refresh cycle.

A memory cell is disposed between each of the row lines and each of the column lines in the arrays. The memory cells employed in the presently preferred embodiment include a single active device and a capacitance storage means. One such memory cell is shown in FIG. 1 and includes the field-effect transistor 46 and capacitor 47. The gate of transistor 46 is coupled to the row line 58, the drain region of transistor 46 is coupled to the column line 59 and the source region of this transistor is coupled to one terminal of capacitor 47. The other terminal of capacitor 47 is coupled to A.C. ground. The capacitor 47, in the presently preferred embodiment, comprises thin oxide regions in the substrate which are voltage biased. As is apparent, the described memory cell is dynamic, that is the charge stored on capacitor 47 is transient.

Assume for sake of discussion that a binary-one is represented by the presence of charge on capacitor 47 and that the binary-zero state is represented by the absence of charge on capacitor 47. If the capacitor 47 is charged, this charge is refreshed or regenerated by the column amplifier coupled to the respective column lines. For example, if charge is present on capacitor 47 and this charge is to be refreshed, line 58 is selected by the application of a positive potential to this line. Then the column amplifier 68 of amplifiers 28 senses the presence of charge on capacitor 47 and replenish this charge. As will be appreciated for the described embodiment when line 58 is selected all 128 cells disposed along this line are simultaneously refreshed by the 128 column amplifiers contained within amplifiers 28. Moreover, as will be described in more detail, since an additional 128 column amplifiers are included within the row of column amplifiers 29 a row of memory cells within array 11 may be simultaneously refreshed with the refreshing of cells within array 10.

Figure 2:
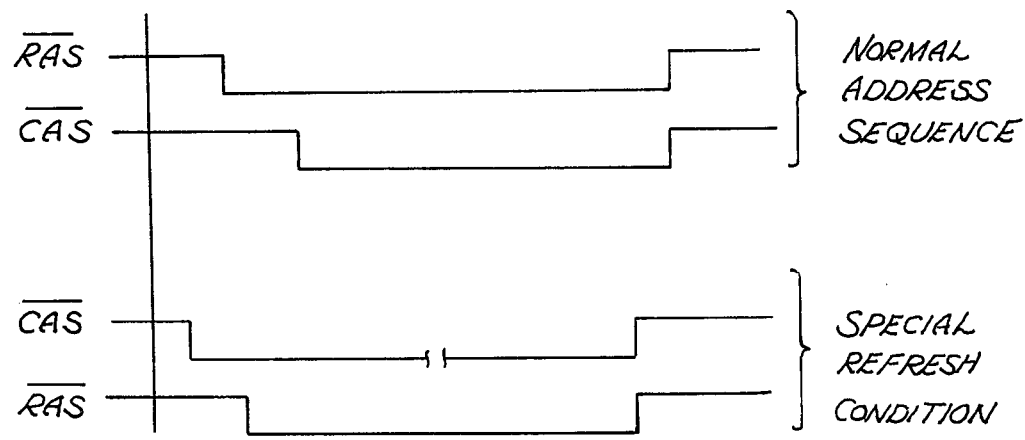
FIG. 2 is a graph illustrating the timing signals used to initiate a refreshing cycle.

In the presently preferred embodiment a row address signal (RAS) is applied to the row address buffers 18 on line 24. This signal activates the buffers and is used to indicate that the address signals $A_0$ through $A_6$ have been applied to the buffers. Similarly a column address signal (CAS) is applied to the column buffers 26 on line 23. This signal is used to indicate that the column address signals $A_7$ through $A_{13}$ have been applied to the buffers 26. In the presently preferred embodiment, when the memory is accessed for the purposes of either reading information from the memory, or writing information into the memory, RAS is applied to the buffers 18 prior to the time that CAS is applied to buffers 26. This sequencing is indicated in the graph of FIG. 2 by the "normal address sequence". (In the presently preferred embodiment $\overline{RAS}$ and $\overline{CAS}$ are externally generated and applied to the memory). When $\overline{RAS}$ drops to its lower level the buffers 18 sense the $A_0$ through $A_6$ signals and communicate these signals to the X-decoders 15 and 16. $\overline{CAS}$ is then applied to indicate that valid address signals $A_7$ through $A_{13}$ have been applied to the buffers 26. As will be discussed in more detail during refreshing the $\overline{CAS}$ signal is first applied to the memory followed by the application of the $\overline{RAS}$ signal. This change in sequence of these signals is detected by the memory and indicates that the memory is to be refreshed.

Figure 3:
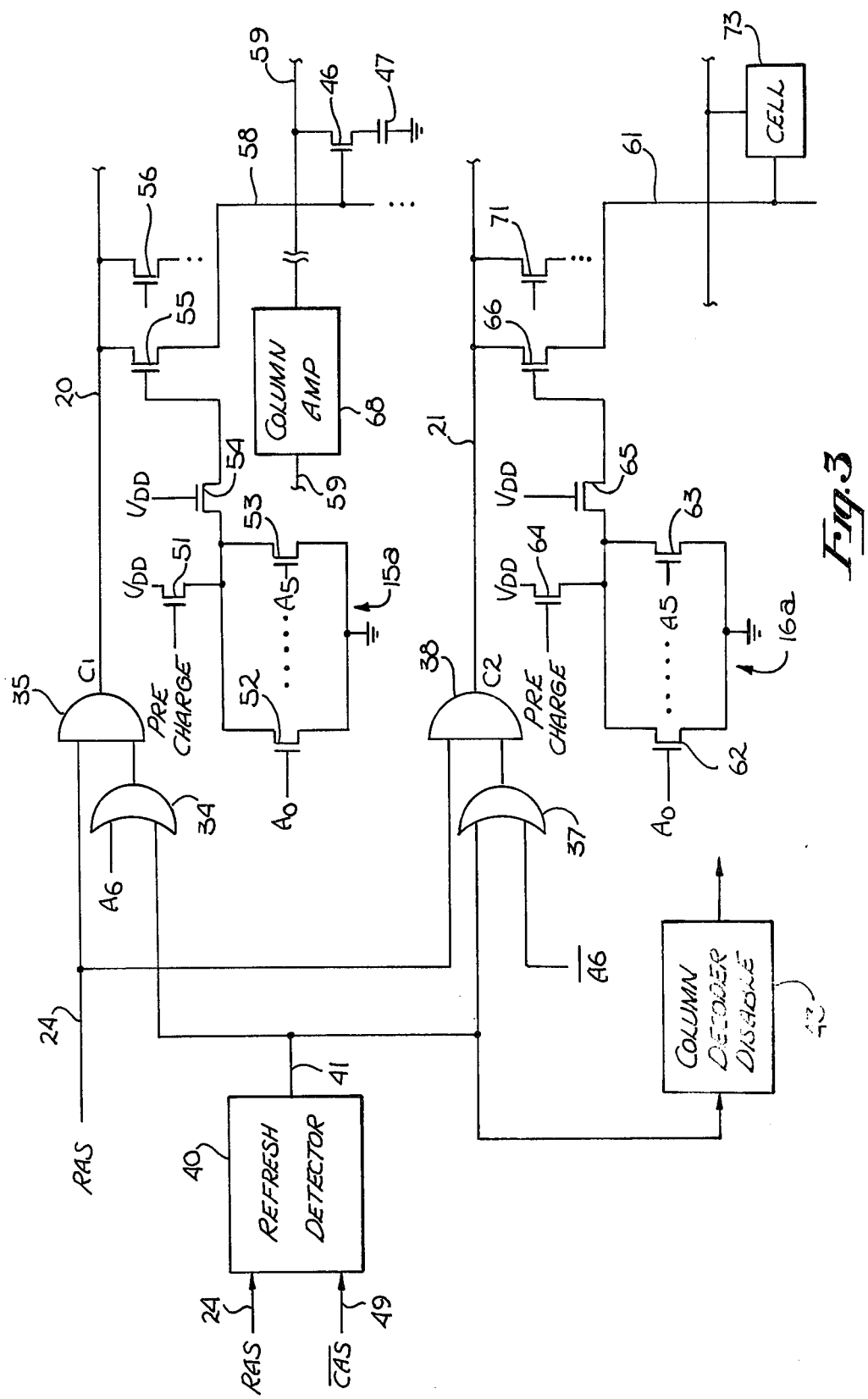
FIG. 3 is a schematic diagram illustrating the refreshing apparatus, and in particular the circuit for simultaneously selecting two row lines during the refreshing cycle.

In FIG. 3 a single decoder from X-decoders 15 is shown as decoder 15a, and a single decoder from X-decoders 16 is illustrated as decoder 16a. The row decoder 15a includes transistors 52 and 53 and other transistors not illustrated which receive the address signal $A_0$ through $A_5$ or their complements. The drain regions of transistors 52 and 53 are coupled to a common node which is precharged through transistor 51. This node is coupled to the gate of transistor 55 through the transfer transistor 54. The drain region of transistor 55 is coupled to the source of the $C_1$ signal, line 20. The source region of transistor 55 is coupled to the row line 58 in array 10. When line 58 is selected, it is driven to a potential close to $V_{DD}$ and in this manner the active device of each of the memory cells coupled to this row line conduct. For example, when transistor 55 conducts, transistor 46 likewise conducts since its gate is coupled to line 58, thus coupling the capacitor 47 of this memory cell to column line 59.

In a similar manner, the other decoders of X-decoders 15 (which receive the different combinations of the address signals $A_0$ through $A_5$ and their complements) are coupled to the gates of transistors having their drain regions coupled to line 20, such as transistor 56. Transistor 56 and the other such transistors associated with each of the decoders are then coupled to each of the row lines in the array 10 in order that a single row line in the array 10 is selected for every combination of the address signals $A_0$ through $A_5$.

The X-decoders are duplicated for array 11 as is shown by the decoder 16a in FIG. 3. This decoder includes decoding transistors 62 and 63 (and four other transistors, not illustrated) which are coupled between the source region of the pull-up transistor 64 and ground. These transistors are coupled to the gate of a transistor 66 through a transfer transistor 65. The source region of transistor 66 is coupled to the row line 61 of array 11. The drain region of transistor 66 is coupled to line 21, the source of the $C_2$ signal. In a similar manner the other decoders of decoders 16 are coupled to transistors having their drain regions common with line 21, such as transistor 71. Thus, as is the case for array 10, for each combination of row address signals $A_0$ through $A_5$ a single row line is activated within the array 11.

The $C_1$ signal is generated by the logic circuit comprising OR gate 34 and AND gate 35. The row address signal (RAS), line 24, is applied to the input terminal of the AND gate 35. The input terminals of the OR gate 34 receive the $A_6$ address signal and the output of the refresh detector 40, line 41. The output terminal of the OR gate 34 is coupled to the other input terminal of the AND gate 35. The output of AND gate 35 is line 20, the source of the $C_1$ signal.

The $C_2$ signal is generated by the logic circuit which includes OR gate 37 and AND gate 38. The input terminals of the OR gate 37 are coupled to receive the output of the refresh detector 40, line 41, and the $\overline{A_6}$ signal from the row address buffers 18 (FIG. 1). The output of the OR gate 37 is coupled to one input terminal of the AND gate 38. The other input terminal of AND gate 38 is coupled to the row address signal (RAS), line 24.

The refresh detector 40 receives RAS, line 24, and $\overline{CAS}$, line 49. Detector 40 provides a signal on line 41 when $\overline{CAS}$ drops in potential before $\overline{RAS}$ drops in potential. This condition is shown in FIG. 2 as the "special refresh condition." The refresh detector 40 may be any one of a plurality of well-known circuits for providing an output signal when the leading edge of one signal occurs before the leading edge of another signal.

The output line 41 of detector 40 is also coupled to a column decoder disable means 43. This disabling means is coupled to the Y-decoders 13 of FIG. 1. The disable means 43 is used to disable the Y-decoders 13 when a signal is present on line 41, that is, during refreshing.

Assume now that the memory is to be accessed. For this condition the leading edge of $\overline{RAS}$ occurs before the leading edge of $\overline{CAS}$ as indicated in FIG. 2, thus no signal is present on line 41, the output of the refresh detector. Since $\overline{RAS}$ is in its lower state, the RAS is in its high state and a binary-one is applied to one input terminal of both AND gates 35 and 38. Assume further that the address signals $A_0$ through $A_5$ are all equal to binary-zeros while the address signal $A_6$ is equal to a binary-one. Since $A_6$ is equal to a binary-one the conditions of the OR gate 34 are met and an output signal is present at the output of OR gate 34. Both inputs to AND gate 35 are positive, thus the $C_1$ signal is positive. Since the $\overline{A_6}$ signal is in its low state, no signal will be present at the output of OR gate 37. Thus, one of the two inputs to the AND gate 38 is low and the $C_2$ signal will remain in its lower state. With the $A_0$ through $A_5$ signals in their lower state both decoders 15a and 16a are selected. This places a positive potential on the gates of both transistors 55 and 66. However, since the $C_2$ signal is in its lower state, no line will be selected within array 11. When the transistor 55 begins to conduct, a positive potential is applied to the row line 58 of array 10. Thus during non-refresh operation for every address $A_0$ through $A_6$, only a single row line within arrays 10 and 11 is selected.

As will be appreciated, if the address signals $A_7$ through $A_{13}$ cause the column line 59 to be coupled to an input/output line, the information stored on the capacitor 47 may be sensed, or information may be written onto capacitor 47. On the other hand, if the $A_6$ signal had also been equal to a binary-zero, the $C_1$ signal would have been low preventing a row line from being selected within the array 10. However the $\overline{A_6}$ signal would have been positive providing an output at OR gate 37. The output at OR gate 37 along with a logic one on line 24 would cause the $C_2$ signal to become positive enabling a row line to have been selected within array 11. Thus if the address signals $A_0$ through $A_6$ were all equal to binary-zeros, transistor 66 conducts and the row line 61 of array 11 is selected. This enables cell 73 to be accessed.

Assume now that the memory of FIG. 1 is to be refreshed as indicated by $\overline{CAS}$ leading $\overline{RAS}$. When this occurs the refresh detector 40 detects the refresh condition and provides a signal on line 41. Since one input to both OR gates 34 and 37 is positive, a signal is present at the output of both these gates, independent of the status of the $A_6$ signal. Since $\overline{RAS}$ is in its lower state a logic one is present on line 24, thus the output conditions for both AND gates 35 and 38 are met. Therefore, during the refreshing cycle both the $C_1$ and the $C_2$ signals are positive.

Assume now that the $A_0$ through $A_5$ address signals are binary-zeros. For this address, independent of $A_6$, both decoders 15a and 16a provide output signals causing the selection of row line 58 in array 10 and row line 61 in array 11. When these rows lines are activated all the memory cells coupled to these row lines are refreshed by the two rows of column amplifiers 28 and 29. That is, all the memory cells along line 58 are refreshed by the column amplifiers 28 and all the memory cells along row line 61 are refreshed by column amplifiers 29. It is apparent that for every combination of the address signals $A_0$ through $A_5$ a single row line will be activated in both arrays 10 and 11. Thus the entire memory of FIG. 1 may be refreshed in 64 cycles, even though the memory includes 128 row lines. In the presently preferred embodiment $\overline{RAS}$ cycles for each new set of address signals $A_0$ through $A_5$ during refreshing while $\overline{CAS}$ remains in its lower state.

Thus with the circuit of FIG. 3 the address signal $A_6$ is employed to identify, or point, to one of the two arrays 10 or 11 in order that a single line in the memory may be accessed. The refresh detector 40 when the refreshing cycle occurs, disables the effect of the $A_6$ signal, allowing simultaneous selection of two lines in the memory, one in each of the arrays.

While the invented concepts have been described and are presently employed in the refreshing of two 8K arrays disposed on a single substrate, the principles thus employed may also be used in other applications such as in wafer scale integration. For example, assume a plurality of memories are disposed on a wafer. Assume further that each of these memories employ dynamic storage devices which require refreshing and that the memories are coupled to a common address bus. With such a system some identification means is required to permit access to a predetermined memory or group of memories. In order to facilitate refreshing of all the memories simultaneously, the principle of the present invention may be employed to disable the identification means, and thus allow a common address to select a plurality of lines in the memories.

Thus a MOS RAM with refreshing apparatus has been described which permits, for the described embodiment, a 128×128 line memory to be refreshed in 64 cycles.

I claim:

1. A dynamic metal-oxide-semiconductor (MOS) random-access memory (RAM), comprising:
   a plurality of lines each coupled to at least one dynamic memory cell;
   decoding means coupled to said plurality of lines, for receiving externally generated address signals and for selecting one of said plurality of lines such that data may be read into and from at least said one memory cell coupled to said selected line, said decoding means for receiving said externally generated address signals during refreshing to identify cells for refreshing;
   refreshing means for refreshing data stored in said dynamic memory cells, said refreshing means coupled to said decoding means such that during refreshing at least two of said plurality of lines are selected by said decoding means for each of said externally generated address signals;
   whereby said dynamic memory cells may be more quickly refreshed.

2. The MOS RAM defined by claim 1 wherein said RAM is divided into at least two memory arrays.

3. The MOS RAM defined by claim 2 wherein each of said arrays includes a row of sensing amplifiers, said sensing amplifier being employed for refreshing.

4. The MOS RAM defined by claim 3 wherein one bit of said address signals is used for selecting one of said arrays such that said one of said plurality of lines in said arrays may be selected.

5. The MOS RAM defined by claim 4 wherein said refreshing means overides the effect of said one bit during refreshing.

6. The MOS RAM defined by claim 5 including refresh detection means for detecting a refresh condition and for generating a refresh signal, said refresh detection means coupled to said decoding means.

7. The MOS RAM defined by claim 6 wherein said refresh detection means is coupled to a source of address timing signals.

8. In a metal-oxide-semiconductor memory system which includes a plurality of dynamic storage arrays, each array including decoding means for decoding first externally generated address signals which are coupled to each of said arrays such that a line is selectable in each of said arrays and for receiving said externally generated first address signals during refreshing to identify a line in each of said arrays for refreshing; an apparatus for simultaneously refreshing memory cells in each of said arrays and for accessing a single line in one of said arrays comprising:

identification means coupled to each of said arrays for receiving a second externally generated address signal and for identifying one of said arrays in response to said second address signal such that a single array line may be accessed in said one of said arrays by said first address signals;

disabling means coupled to said identification means for disabling said identification means during refreshing such that said first externally generated address signals select an array line in each of said plurality of arrays;

whereby a plurality of memory cells along said selected array lines may be simultaneously refreshed.

9. The apparatus defined by claim 8 wherein said disabling means includes detection means for detecting a refresh condition.

* * * * *